(12) United States Patent
Imai et al.

(10) Patent No.: US 12,719,010 B2
(45) Date of Patent: Aug. 25, 2026

(54) CHARGED PARTICLE BEAM DEVICE

(71) Applicant: Hitachi High-Tech Corporation, Tokyo (JP)

(72) Inventors: Yuta Imai, Tokyo (JP); Teruo Kohashi, Tokyo (JP); Junichi Katane, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 380 days.

(21) Appl. No.: 18/292,070

(22) PCT Filed: Sep. 29, 2021

(86) PCT No.: PCT/JP2021/035740
§ 371 (c)(1),
(2) Date: Jan. 25, 2024

(87) PCT Pub. No.: WO2023/053237
PCT Pub. Date: Apr. 6, 2023

(65) Prior Publication Data

US 2025/0006454 A1 Jan. 2, 2025

(51) Int. Cl.
*H01J 37/14* (2006.01)
*H01J 37/147* (2006.01)
(Continued)

(52) U.S. Cl.
CPC ........ *H01J 37/1474* (2013.01); *H01J 37/222* (2013.01); *H01J 37/244* (2013.01); (Continued)

(58) Field of Classification Search
CPC .... H01J 37/1474; H01J 37/222; H01J 37/244; H01J 37/265; H01J 37/28; H01J 2237/221; H01J 2237/2448; H01J 2237/24495
See application file for complete search history.

(56) References Cited

U.S. PATENT DOCUMENTS 11,043,358 B2 * 6/2021 Araki ...................... H01J 37/28
2008/0251719 A1 10/2008 Nakahira et al.
(Continued)

FOREIGN PATENT DOCUMENTS

JP 2008-177064 A 7/2008
JP 2010-062106 A 3/2010
(Continued)

OTHER PUBLICATIONS

International Search Report of PCT/JP2021/035740 dated Dec. 21, 2021.

*Primary Examiner* — Nicole M Ippolito
(74) *Attorney, Agent, or Firm* — MATTINGLY & MALUR, PC

(57) ABSTRACT

A charged particle beam device includes: a charged particle source configured to generate a charged particle beam; a scanning unit configured to scan a sample while deflecting the charged particle beam; a detector configured to detect secondary particles emitted from the sample and output a detection signal; and a control unit configured to generate an observation image of the sample based on the detection signal. The control unit generates a mixed-condition image, in which detection signals under different detection conditions are mixed in a single image, by changing a detection condition of the detector for each pixel in a process of scanning the sample, and uses the mixed-condition image to restore a single-condition image which is an image for each detection condition.

12 Claims, 7 Drawing Sheets

(51) Int. Cl.

| | |
|---|---|
| ***H01J 37/22*** | (2006.01) |
| ***H01J 37/24*** | (2006.01) |
| ***H01J 37/244*** | (2006.01) |
| ***H01J 37/26*** | (2006.01) |
| ***H01J 37/28*** | (2006.01) |

(52) U.S. Cl.

CPC ............ *H01J 37/265* (2013.01); *H01J 37/28* (2013.01); *H01J 2237/221* (2013.01); *H01J 2237/2448* (2013.01); *H01J 2237/24495* (2013.01)

(56) References Cited

U.S. PATENT DOCUMENTS

| | | | | |
|---|---|---|---|---|
| 2011/0187847 | A1 | 8/2011 | Bai et al. | |
| 2015/0069233 | A1 | 3/2015 | Anderson et al. | |
| 2016/0336145 | A1 | 11/2016 | Ominami et al. | |
| 2017/0213355 | A1 | 7/2017 | Hujsak et al. | |
| 2020/0126754 | A1* | 4/2020 | Numata | H01J 37/265 |

FOREIGN PATENT DOCUMENTS

| | | | |
|---|---|---|---|
| JP | 2014-075365 | A | 4/2014 |
| JP | 2014-127224 | A | 7/2014 |
| WO | 2010/026833 | A1 | 3/2010 |

* cited by examiner

[FIG. 1]
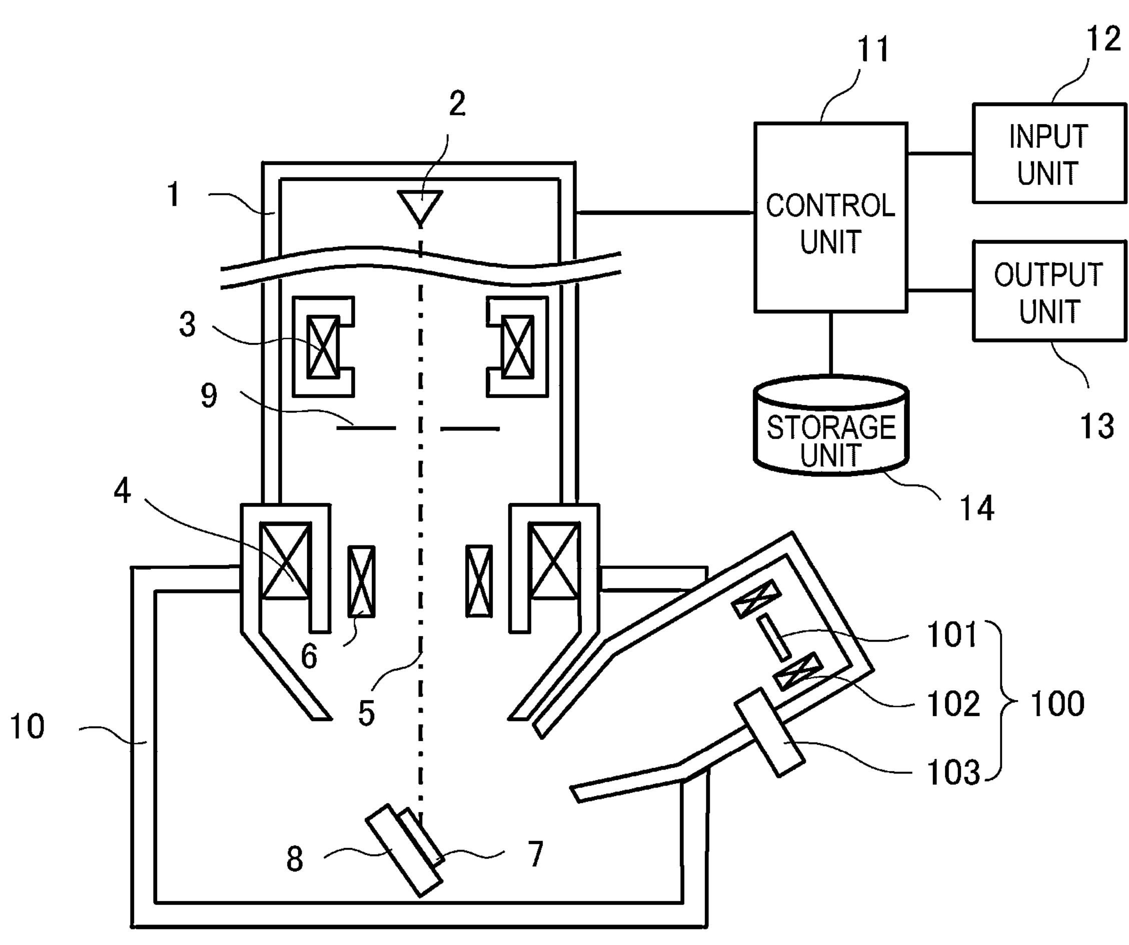

[FIG. 2]
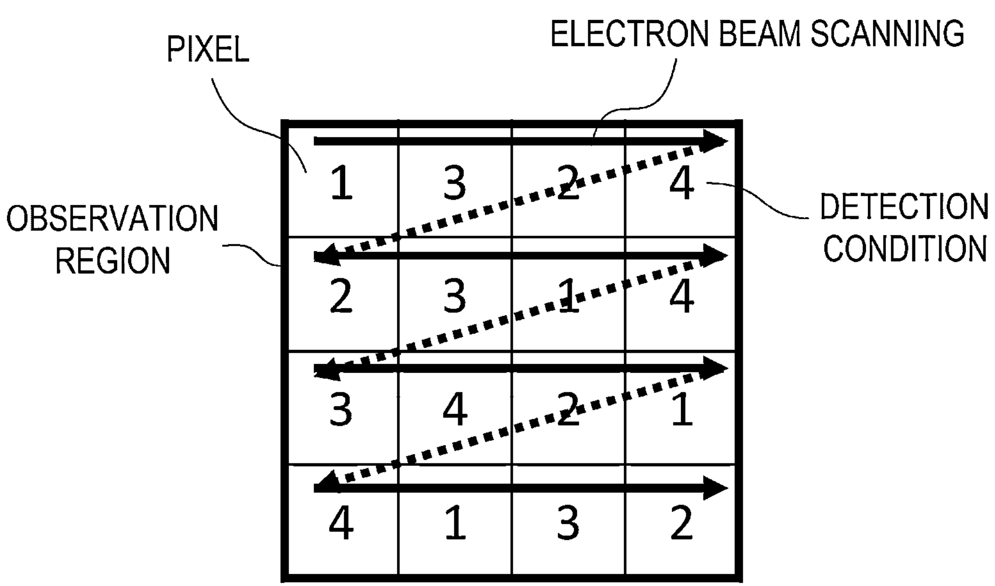
[FIG. 3]
PIXEL
OBSERVATION REGION
1
1
1
DETECTION CONDITION
1

[FIG. 4]
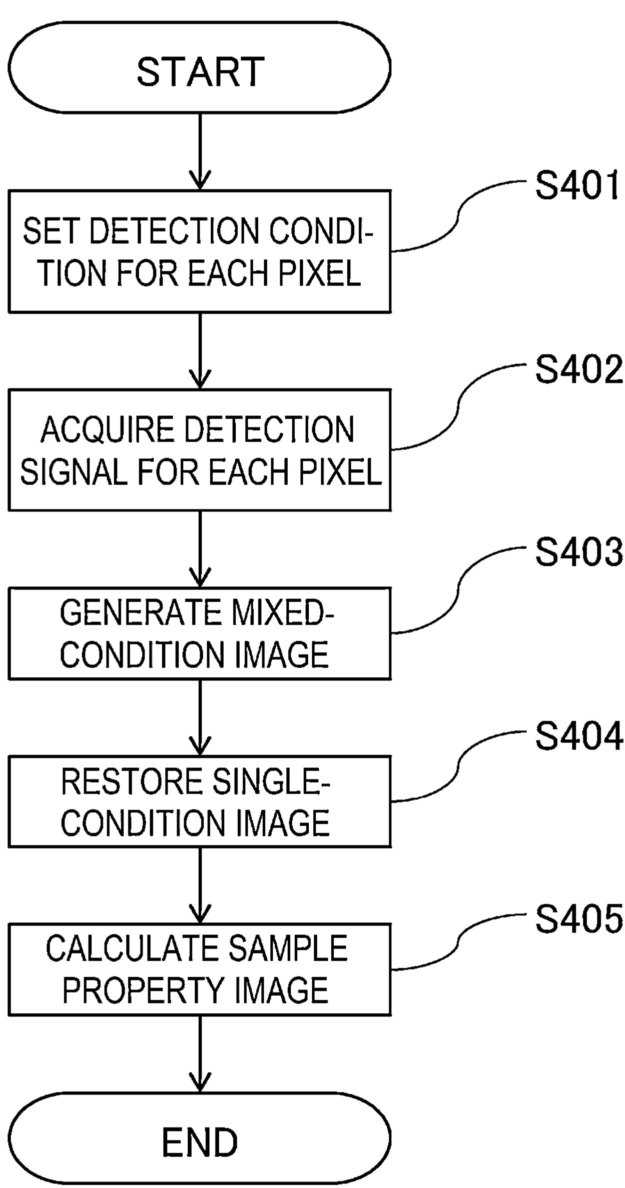

[FIG. 5]
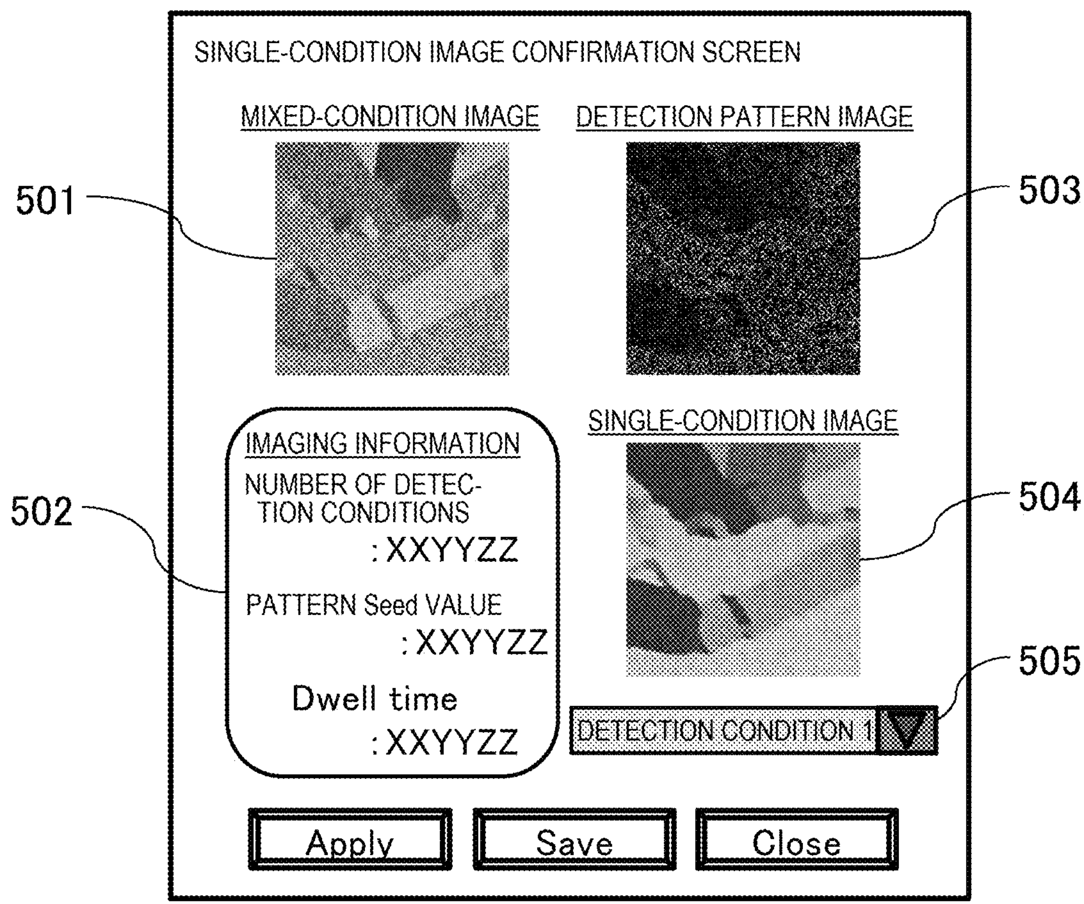
[FIG. 6]
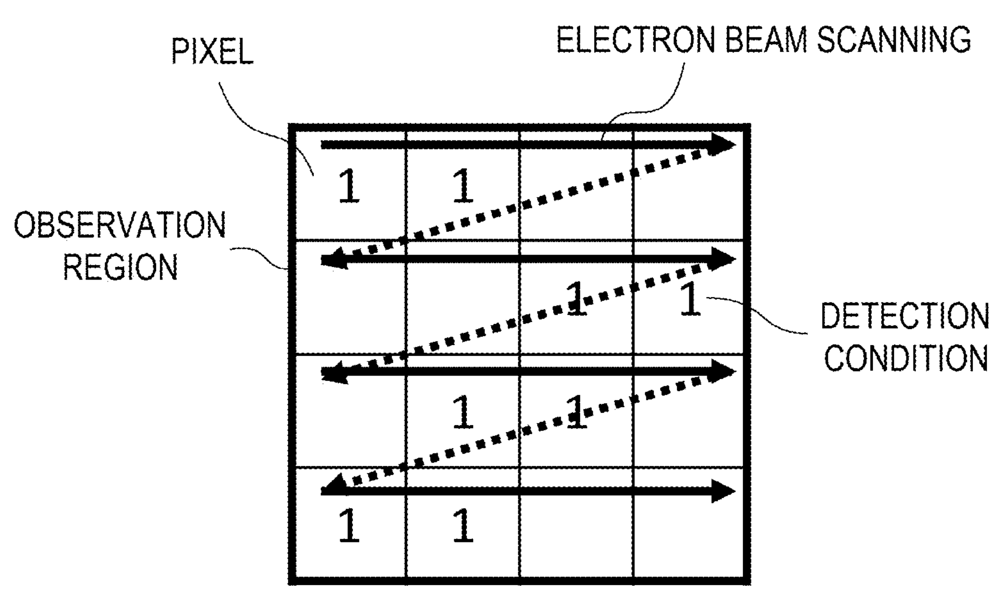

[FIG. 7]
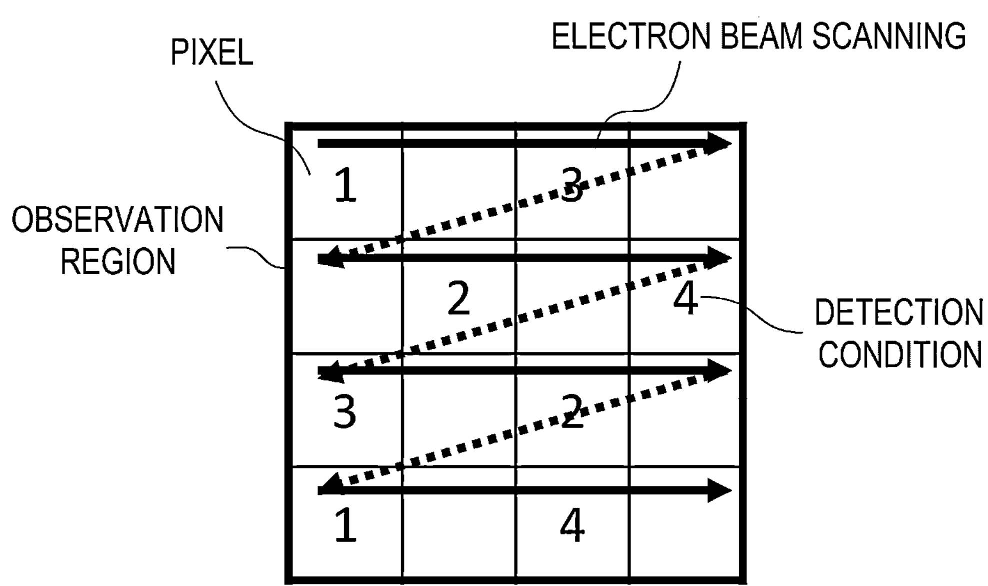

[FIG. 8]
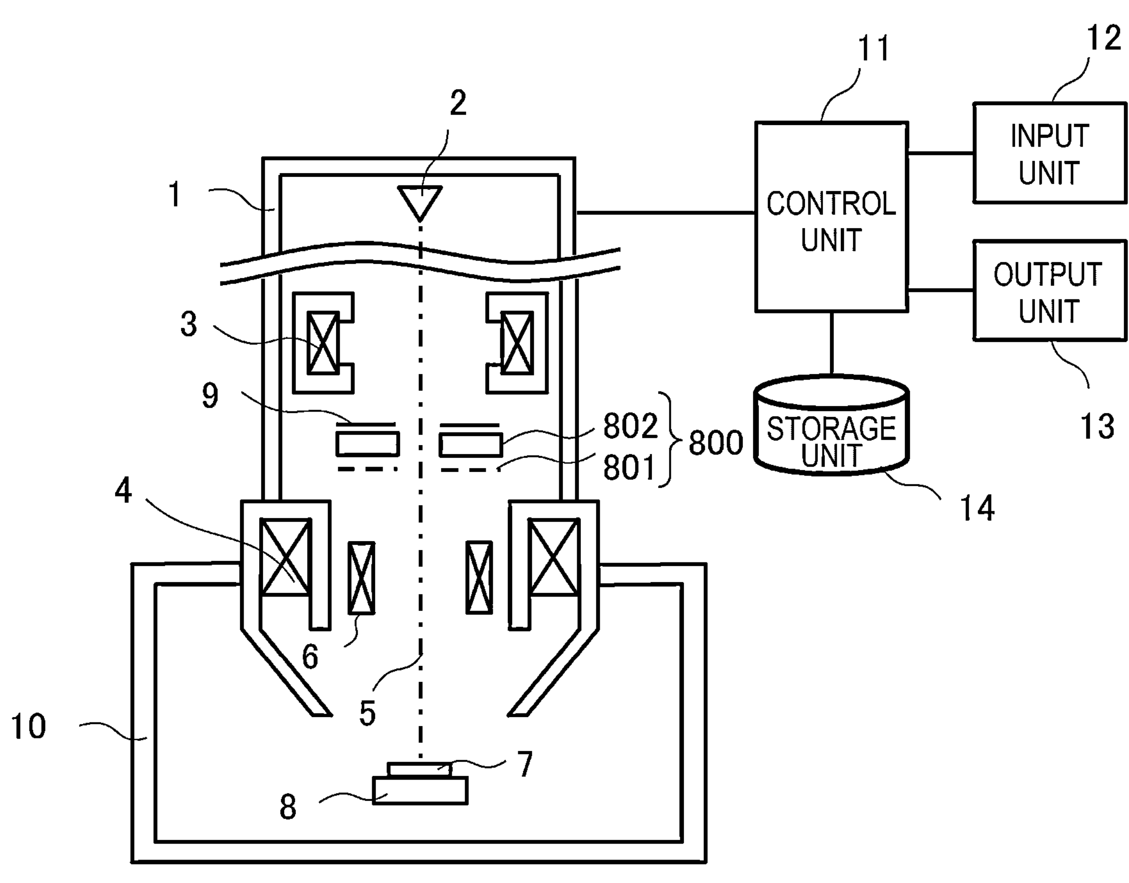

[FIG. 9]
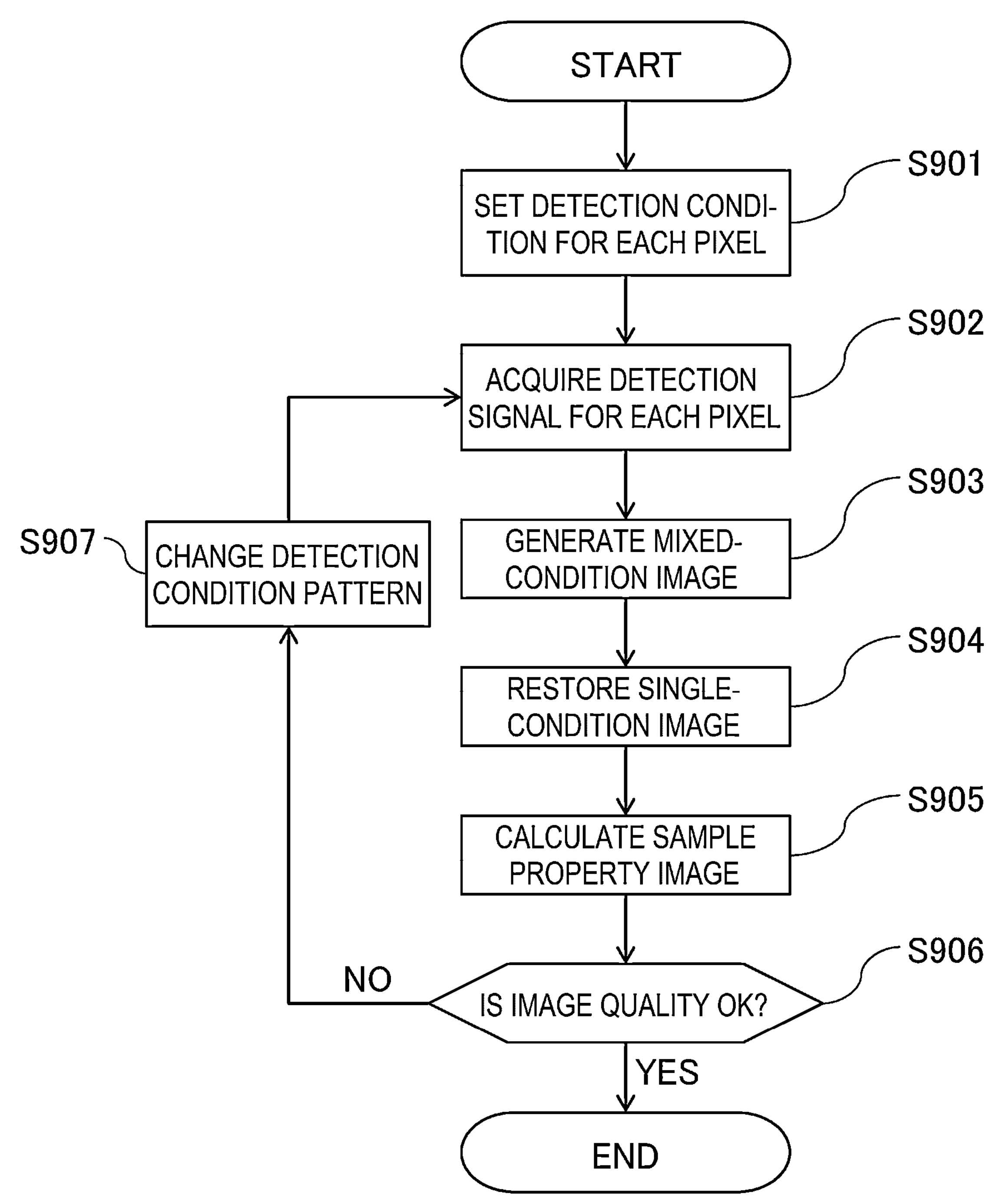

CHARGED PARTICLE BEAM DEVICE

TECHNICAL FIELD

The present invention relates to a charged particle beam device that generates an observation image of a sample by irradiating the sample with a charged particle beam and detecting electrons emitted from the sample.

BACKGROUND ART

A charged particle beam device is a device that irradiates a sample with a charged particle beam such as an electron beam, detects secondary particles such as secondary electrons, reflected electrons, Auger electrons, and X-ray photons emitted from the sample, and generates an observation image of the sample. In particular, a magnetization distribution of the sample is measured by detecting a spin polarization of the secondary electrons with a spin detector, and a composition distribution of the sample is measured by detecting energy of the Auger electrons with an energy detector.

PTL 1 discloses that, in order to measure a magnetization distribution and a composition distribution at the same time with the same electron beam scanning, among electrons emitted from a sample by irradiation with an electron beam, low-energy electrons are deflected to a spin detector, and high-energy electrons are deflected to an energy detector. It is also disclosed that, in order to image a plurality of element distributions, an operating condition of a deflector that deflects electrons to the energy detector is changed in several stages during irradiation of one point with an electron beam, that is, during one pixel measurement, or is switched each time one line measurement is completed.

CITATION LIST

Patent Literature

PTL 1: JP2014-127224A

SUMMARY OF INVENTION

Technical Problem

However, when the operating condition is changed in several stages during the one pixel measurement as in PTL 1, it takes time to acquire data. In addition, when the operating condition is switched each time the one line measurement is completed, data is not acquired under different operating conditions in one line, and detailed analysis becomes difficult.

Therefore, an object of the invention is to provide a charged particle beam device capable of quickly obtaining a plurality of charged particle beam images under different detection conditions in the same field of view.

Solution to Problem

In order to achieve the above object, the invention relates to a charged particle beam device including: a charged particle source configured to generate a charged particle beam; a scanning unit configured to scan a sample while deflecting the charged particle beam; a detector configured to detect secondary particles emitted from the sample and output a detection signal; and a control unit configured to generate an observation image of the sample based on the detection signal. The control unit generates a mixed-condition image, in which detection signals under different detection conditions are mixed in a single image, by changing a detection condition of the detector for each pixel in a process of scanning the sample and uses the mixed-condition image to restore a single-condition image which is an image for each detection condition.

Advantageous Effects of Invention

According to the invention, it is possible to provide a charged particle beam device capable of quickly obtaining a plurality of charged particle beam images under different detection conditions in the same field of view.

BRIEF DESCRIPTION OF DRAWINGS

FIG. 1 is a diagram showing an example of an overall configuration of a charged particle beam device according to Embodiment 1.

FIG. 2 is a diagram showing a mixed-condition image in which detection signals under different detection conditions are mixed.

FIG. 3 is a diagram showing pixels of a specific detection condition extracted from the mixed-condition image.

FIG. 4 is a diagram showing an example of a processing flow according to Embodiment 1.

FIG. 5 is a diagram showing an example of a confirmation screen of a single-condition image.

FIG. 6 is a diagram showing an example of a special mixed-condition image.

FIG. 7 is a diagram showing another example of the special mixed-condition image.

FIG. 8 is a diagram showing an example of an overall configuration of a charged particle beam device according to Embodiment 2.

FIG. 9 is a diagram showing an example of a processing flow according to Embodiment 2.

DESCRIPTION OF EMBODIMENTS

Hereinafter, embodiments of a charged particle beam device according to the invention will be described with reference to the accompanying drawings. A charged particle beam device is a device that irradiates a sample with a charged particle beam such as an electron beam, detects secondary particles such as secondary electrons, reflected electrons, Auger electrons, and X-ray photons emitted from the sample, and generates an observation image of the sample. Hereinafter, as an example of the charged particle beam device, a spin-polarization scanning electron microscope that detects a spin polarization of the secondary electrons emitted from the sample and a scanning electron microscope that detects energy of the electrons emitted from the sample will be described.

Embodiment 1

An overall configuration of a spin-polarization scanning electron microscope according to Embodiment 1 will be described with reference to FIG. 1. The spin-polarization scanning electron microscope includes a mirror body 1, a sample chamber 10, and a control unit 11. The mirror body 1 includes an electron source 2, a condenser lens 3, an aperture 9, a deflector 6, and an objective lens 4. The sample chamber 10 includes a sample 7, a sample stage 8, and a spin detector 100. The mirror body 1 and the sample chamber 10 are evacuated by a vacuum pump (not shown).

The electron source 2 is a device that generates, by emitting and accelerating electrons, an electron beam with which the sample 7 is to be irradiated. The electron beam generated by the electron source 2 travels along an optical axis 5, is focused by the condenser lens 3, passes through the aperture 9, is deflected by the deflector 6, and is focused by the objective lens 4. By deflection in the deflector 6, a surface of the sample 7 is two-dimensionally scanned with the electron beam.

The spin detector 100 is a device that detects a spin direction of secondary electrons emitted from the surface of the sample 7 scanned with the electron beam, and includes an iron thin film 101, a coil 102, and an electron detector 103. The iron thin film 101 is a target with which the secondary electrons emitted from the sample 7 collide and emits reflected electrons due to collision with the secondary electrons. The coil 102 generates a magnetic field for setting a magnetization direction of the iron thin film 101. The electron detector 103 detects the reflected electrons emitted from the iron thin film 101. Since an amount of the reflected electrons emitted from the iron thin film 101 varies depending on a relationship between the spin direction of the secondary electrons and the magnetization direction of the iron thin film 101, the spin direction of the secondary electrons can be detected by detecting the reflected electrons while controlling the magnetization direction of the iron thin film 101 by the coil 102.

The control unit 11 is a device that controls each unit provided in the mirror body 1 and the sample chamber 10, and is, for example, a general-purpose computer. The computer includes a processor such as a central processing unit (CPU) and a memory such as a random access memory (RAM) or a read only memory (ROM). The control unit 11 executes processing of generating an observation image of the sample 7 based on a detection signal output from the spin detector 100 and calculating a new image using a plurality of observation images. The processing in the control unit 11 may be implemented when the CPU executes a program loaded in the memory. A part of the control unit 11 may be implemented by hardware such as a dedicated circuit board.

An input unit 12, an output unit 13, and a storage unit 14 are connected to the control unit 11. The input unit 12 is a device for an operator to input imaging conditions of an observation image, and is, for example, a keyboard, a mouse, or a touch panel. The output unit 13 is a device for displaying imaging conditions and observation images, and is, for example, a liquid crystal display or a touch panel. The storage unit 14 is a device for storing observation images and data on imaging conditions, and is, for example, a hard disk drive (HDD) or a solid state drive (SSD).

The observation image generated based on the detection signal output from the spin detector 100 is an image corresponding to a magnetization distribution in a direction set in the iron thin film 101. That is, in order to obtain an image corresponding to a magnetization distribution in a different direction, the magnetization direction of the iron thin film 101, which is a detection condition of the spin detector 100, is reset, and imaging is performed again. For example, in order to obtain magnetization distributions in four directions including a positive direction and a negative direction of an X axis as well as a positive direction and a negative direction of a Y axis orthogonal to the X axis, it is necessary to perform imaging four times, resulting in a decrease in imaging throughput.

Therefore, in Embodiment 1, a mixed-condition image in which detection signals under different detection conditions are mixed is generated by changing the magnetization direction of the iron thin film 101, which is the detection condition of the spin detector 100, for each pixel during one time of imaging, and a single-condition image, which is an image under a single detection condition, is restored based on the mixed-condition image. That is, the decrease in throughput is prevented by performing imaging only once, and a plurality of observation images under different detection conditions in the same field of view are obtained by restoring the single-condition image based on the mixed-condition image generated by the one time of imaging.

The mixed-condition image will be described with reference to FIG. 2. To simplify the description, FIG. 2 shows a 16-pixel observation region in which four pixels are arranged in each of a vertical direction and a horizontal direction. Electron beam scanning for the observation region is raster scanning, in which scanning in the horizontal direction is sequentially repeated in the vertical direction. Numbers 1 to 4 shown in each pixel represent detection conditions of the spin detector 100. That is, in a process of the electron beam scanning, the detection condition of the spin detector 100 is changed for each pixel. FIG. 2 shows an example of the mixed-condition image including four pixels for each detection condition.

FIG. 3 shows pixels of a detection condition 1 extracted from the mixed-condition image in FIG. 2. Since pixels other than those of the detection condition 1 do not have pixel values, FIG. 3 shows a sparse sampling image. A single-condition image, which is an image under a single detection condition, is restored by applying, for example, compression sensing to the sparse sampling image shown in FIG. 3. When applying the compression sensing, in the sparse sampling image, it is preferable that pixels of different detection conditions are included in one line in which the pixels are arranged, and it is more preferable that pixels of the same detection condition are sparsely arranged.

An example of a processing flow according to Embodiment 1 will be described with reference to FIG. 4.

(S401)

The control unit 11 sets a detection condition for each pixel. The detection condition for each pixel may be set, for example, by reading a predetermined detection condition pattern from the storage unit 14, or may be randomly set. In the predetermined detection condition pattern, it is preferable that detection conditions of adjacent pixels are different as shown in FIG. 2 and the pixels of the same detection condition are sparsely arranged. More specifically, it is preferable that an average value of shortest distances between pixels of the same detection condition is larger than one pixel. It is preferable that the number of pixels for each detection condition is equal to or less than a number obtained by dividing a total number of pixels in the observation region by the number of detection conditions.

(S402)

The control unit 11 causes the spin detector 100 to acquire a detection signal for each pixel based on the detection condition set for each pixel in S401 while scanning the sample 7 with an electron beam generated by the electron source 2.

(S403)

The control unit 11 generates a mixed-condition image based on the detection signal acquired in S402.

(S404)

The control unit 11 restores a single-condition image based on the mixed-condition image generated in S403.

Specifically, a sparse sampling image as shown in FIG. 3 is generated by extracting pixels of a specific detection condition from the mixed-condition image, and the single-condition image is restored by applying compression sensing to the sparse sampling image. Generation of the sparse sampling image and restoration of the single-condition image are performed for the number of detection conditions. For example, in order to obtain images corresponding to magnetization distributions of the iron thin film 101 in the positive direction and the negative direction of the X axis as well as the positive direction and the negative direction of the Y axis, four sparse sampling images are generated based on one mixed-condition image, and four single-condition images based on the four sparse sampling images are restored. The restored single-condition image is displayed on the output unit 13 and confirmed by the operator.

An example of a confirmation screen of the single-condition image will be described with reference to FIG. 5. The confirmation screen of the single-condition image shown in FIG. 5 includes a mixed-condition image display unit 501, an imaging information display unit 502, a detection pattern image display unit 503, a single-condition image display unit 504, and a detection condition selection unit 505. The mixed-condition image display unit 501 displays the mixed-condition image generated in S403.

The imaging information display unit 502 displays the number of detection conditions, a pattern Seed value, a Dwell time, and the like as information related to imaging. The number of detection conditions is the number of detection conditions included in the mixed-condition image. The pattern Seed value is a seed value of a random number used when a detection condition for each pixel is randomly set. The Dwell time is a time required to acquire a detection signal for one pixel.

The detection condition selection unit 505 selects one of a plurality of detection conditions included in the mixed-condition image. FIG. 5 shows a case where the detection condition 1 is selected.

The detection pattern image display unit 503 displays an image obtained by extracting pixels of a detection condition selected by the detection condition selection unit 505 from the mixed-condition image. FIG. 5 shows an image of the detection condition 1 extracted from the mixed-condition image.

The single-condition image display unit 504 displays a single-condition image of the detection condition selected by the detection condition selection unit 505 from a plurality of single-condition images restored in S404. FIG. 5 shows a single-condition image of the detection condition 1.

Returning to the description of FIG. 4.

(S405)

The control unit 11 calculates a sample property image representing a distribution of property values of the sample 7 using the single-condition image restored in S404. For example, when single-condition images corresponding to the magnetization distributions of the iron thin film 101 in the positive direction and the negative direction of the X axis as well as the positive direction and the negative direction of the Y axis are X+, X−, Y+, and Y−, respectively, a sample property image representing a magnetization distribution of the sample 7 is calculated by the following expression.

$$((X+)-(X-))/((Y+)-(Y-)) \quad \text{(Expression 1)}$$

The calculated sample property image is displayed on the output unit 13. The sample property image is not limited to an image representing the magnetization distribution of the sample 7, and may be an image representing a distortion distribution derived based on the magnetization distribution. The execution in S405 is not essential.

According to the processing flow described with reference to FIG. 4, a mixed-condition image in which detection signals under different detection conditions are mixed is generated by one time of imaging, and a single-condition image, which is an image under a single detection condition, is restored based on the mixed-condition image. That is, since only one time of imaging is required, a decrease in throughput is prevented, and a plurality of observation images under different detection conditions in the same field of view can be obtained by restoring the single-condition image based on the mixed-condition image.

As for the detection condition for each pixel set in S401, the detection condition for adjacent pixels may be the same as shown in FIG. 6 as long as the pixels of the same detection condition are sparsely arranged. That is, a mixed-condition image in which pixels of the same detection condition are adjacent to each other may be generated. The detection condition may not be set for all the pixels in the observation region, and as shown in FIG. 7, pixels for which no detection condition is set may be included as long as the pixels of the same detection condition are sparsely arranged. That is, a mixed-condition image including pixels having no detection signal may be generated.

Embodiment 2

In Embodiment 1, restoration of the single-condition image based on the mixed-condition image generated using the spin-polarization scanning electron microscope has been described. The charged particle beam device used for generating the mixed-condition image is not limited to the spin-polarization scanning electron microscope. In Embodiment 2, generation of a mixed-condition image using a scanning electron microscope that detects energy of electrons will be described. In Embodiment 2, a part of configurations and functions described in Embodiment 1 can be applied, and thus the same configurations and functions are denoted by the same reference numerals and description thereof will be omitted.

An overall configuration of the scanning electron microscope according to Embodiment 1 will be described with reference to FIG. 8. A difference with the spin-polarization electron microscope according to Embodiment 1 is that an energy detector 800 is provided instead of the spin detector 100.

The energy detector 800 is a device that detects energy of electrons emitted from a surface of the sample 7 scanned with an electron beam and includes an energy discriminator 801 and an electron detector 802. The energy discriminator 801 is a device that discriminates the electrons according to the energy thereof, and is, for example, a deflector that deflects a trajectory of the electrons. The electron detector 802 detects the electrons passing through the energy discriminator 801. That is, by controlling the energy of the electrons discriminated by the energy discriminator 801, only electrons having predetermined energy are detected.

Therefore, in Embodiment 2, the energy of the electrons discriminated by the energy discriminator 801 is used as a detection condition, a mixed-condition image is generated according to a processing flow in FIG. 4, and a single-condition image is restored based on the generated mixed-condition image. A sample property image may be calculated based on the single-condition image. When an image quality of the single-condition image or the sample property image is insufficient, a detection condition pattern may be changed to generate a mixed-condition image again.

An example of a processing flow in a case where the detection condition pattern is changed to generate the mixed-condition image again when the image quality of the single-condition image or the sample property image is insufficient will be described with reference to FIG. 9. The description of the same processing steps as in FIG. 4 will be simplified.

(S901)

The control unit 11 sets a detection condition for each pixel as in S401.

(S902)

The control unit 11 causes the energy detector 800 to acquire a detection signal for each pixel based on the detection condition set for each pixel in S901 while scanning the sample 7 with an electron beam generated by the electron source 2.

(S903)

The control unit 11 generates a mixed-condition image based on the detection signal acquired in S902.

(S904)

Similarly to S403, the control unit 11 restores a single-condition image based on the mixed-condition image generated in S903. The restored single-condition image is displayed on the output unit 13 and confirmed by the operator.

(S905)

Similarly to S405, the control unit 11 calculates a sample property image representing a distribution of property values of the sample 7 using the single-condition image restored in S904. The calculated sample property image is, for example, a composition distribution or a phase distribution representing a distribution of a phase separation state of the sample 7 and is displayed on the output unit 13. The execution in S905 is not essential.

(S906)

The control unit 11 determines whether an image quality of the single-condition image restored in S904, or the sample property image calculated in S905 is sufficient. When the image quality is sufficient, the processing flow ends, and when the image quality is insufficient, the processing returns to S902 via S907. The determination in S906 may depend on whether a predetermined image quality condition is satisfied, or may be based on a determination result of the operator.

(S907)

The control unit 11 changes a detection condition pattern. After the detection condition pattern is changed, a detection signal for each pixel is acquired again in S902.

A method for changing the detection condition pattern differs depending on an index of the image quality determined to be insufficient in S906. That is, when a spatial resolution of the single-condition image or the sample property image is equal to or less than a predetermined threshold and is insufficient, a similarity or a thinning rate is lowered. Alternatively, when an amount of artifacts in the single-condition image or the sample property image is equal to or more than a predetermined threshold and is apparent, the similarity or the thinning rate is increased. Here, the similarity represents a degree to which detection conditions are similar between adjacent pixels in the detection condition pattern, and has a smaller value as the detection conditions are less similar. The thinning rate represents a ratio of pixels for which no detection signal is acquired in the observation region. By changing the detection condition pattern, the image quality of the single-condition image or the sample property image is improved.

According to the processing flow described with reference to FIG. 9, since the single-condition image is restored based on the mixed-condition image generated in one time of imaging, a decrease in throughput is prevented and a plurality of observation images under different detection conditions are obtained in the same field of view. When an image quality of the obtained observation image is insufficient, the image quality of the observation image is improved by appropriately changing the detection condition pattern according to an index of the image quality. The processing flow shown in FIG. 9 may be executed in a spin-polarization scanning electron microscope.

A plurality of embodiments of the invention have been described above. The invention is not limited to the above embodiments and can be embodied by modifying components without departing from the gist of the invention. A plurality of components disclosed in the above embodiments may be combined appropriately. Further, some components may be deleted from all the components shown in the above embodiments.

REFERENCE SIGNS LIST

1: mirror body
2: electron source
3: condenser lens
4: objective lens
5: optical axis
6: deflector
7: sample
8: sample stage
9: aperture
10: sample chamber
11: control unit
12: input unit
13: output unit
14: storage unit
100: spin detector
101: iron thin film
102: coil
103: electron detector
501: mixed-condition image display unit
502: imaging information display unit
503: detection pattern image display unit
504: single-condition image display unit
505: detection condition selection unit
800: energy detector
801: energy discriminator
802: electron detector

The invention claimed is:

1. A charged particle beam device comprising:

a charged particle source configured to generate a charged particle beam;

a scanning unit configured to scan a sample while deflecting the charged particle beam;

a detector configured to detect secondary particles emitted from the sample and output a detection signal; and a control unit configured to generate an observation image of the sample based on the detection signal, wherein the control unit generates a mixed-condition image, in which detection signals under different detection conditions are mixed in a single image, by changing a detection condition of the detector for each pixel in a process of scanning the sample, and uses the mixed-condition image to restore a single-condition image which is an image for each detection condition.

2. The charged particle beam device according to claim 1, wherein the control unit changes the detection condition of the detector for each pixel according to a predetermined pattern.

3. The charged particle beam device according to claim 2, wherein the control unit changes the pattern according to an image quality of the single-condition image.

4. The charged particle beam device according to claim 3, wherein when a spatial resolution of the single-condition image is equal to or less than a threshold, the control unit lowers a similarity or a thinning rate included in the pattern.

5. The charged particle beam device according to claim 3, wherein when an artifact included in the single-condition image is equal to or more than a threshold, the control unit increases a similarity or a thinning rate included in the pattern.

6. The charged particle beam device according to claim 1, wherein the control unit randomly changes the detection condition of the detector for each pixel.

7. The charged particle beam device according to claim 1, wherein in the mixed-condition image, the number of pixels for each detection condition is equal to or less than a number obtained by dividing a total number of pixels by the number of detection conditions.

8. The charged particle beam device according to claim 1, wherein in the mixed-condition image, an average value of shortest distances between pixels of the same detection condition is larger than one pixel.

9. The charged particle beam device according to claim 1, wherein the control unit calculates a sample property image representing a distribution of property values of the sample using a plurality of single-condition images.

10. The charged particle beam device according to claim 9, wherein the sample property image is an image representing any one of a magnetization distribution, a distortion distribution, a composition distribution, and a phase distribution of the sample.

11. The charged particle beam device according to claim 1, wherein the detector is a spin detector including an iron thin film and a plurality of coils that magnetize the iron thin film.

12. The charged particle beam device according to claim 11, wherein the detection condition is a magnetization direction set for the iron thin film by the coils.

* * * * *